(12) United States Patent
Sakai et al.

(10) Patent No.: US 9,476,565 B2
(45) Date of Patent: Oct. 25, 2016

(54) ILLUMINATING APPARATUS AND METHOD OF PRODUCING LENS SHEET USED THEREIN

(71) Applicant: MINEBEA CO., LTD., Kitasaku-gun, Nagano (JP)

(72) Inventors: Koji Sakai, Fukuroi (JP); Ryohei Takayama, Fukuroi (JP)

(73) Assignee: MINEBEA CO., LTD., Kitasaku-gu (JP)

( * ) Notice: Subject to any disclaimer, the term of this patent is extended or adjusted under 35 U.S.C. 154(b) by 19 days.

(21) Appl. No.: 13/916,238

(22) Filed: Jun. 12, 2013

(65) Prior Publication Data

US 2013/0343035 A1    Dec. 26, 2013

(30) Foreign Application Priority Data

Jun. 21, 2012    (JP) .................................. 2012-139734

(51) Int. Cl.

| | |
|---|---|
| *F21V 5/04* | (2006.01) |
| *F21V 13/02* | (2006.01) |
| *F21V 5/00* | (2015.01) |
| *F21V 5/02* | (2006.01) |
| *G02B 5/02* | (2006.01) |
| *F21Y 101/02* | (2006.01) |

(52) U.S. Cl.
CPC ............. *F21V 5/045* (2013.01); *F21V 5/007* (2013.01); *F21V 5/02* (2013.01); *F21V 13/02* (2013.01); *G02B 5/0221* (2013.01); *G02B 5/0278* (2013.01); *G02B 5/0294* (2013.01); *F21V 5/005* (2013.01); *F21Y 2101/02* (2013.01)

(58) Field of Classification Search
CPC ............. F21V 17/00; F21V 5/00; F21V 5/02; F21V 5/04; F21Y 2101/02; F21W 2121/00; F21W 2101/02; F21S 48/1233
USPC ....................... 362/311.01, 311.06, 331, 337
See application file for complete search history.

(56) References Cited

U.S. PATENT DOCUMENTS

| | | | |
|---|---|---|---|
| 6,654,176 B2 | 11/2003 | Yoshikawa et al. | |
| 7,009,774 B2 | 3/2006 | Yoshikawa et al. | |
| 7,160,016 B2* | 1/2007 | Yu et al. | 362/620 |
| 7,290,902 B2* | 11/2007 | Suehiro et al. | 362/347 |

(Continued)

FOREIGN PATENT DOCUMENTS

| | | |
|---|---|---|
| JP | A-11-53922 | 2/1999 |
| JP | 2003-121612 A | 4/2003 |
| JP | A-2007-220465 | 8/2007 |
| JP | A-2009-158473 | 7/2009 |

*Primary Examiner* — Jong-Suk (James) Lee
*Assistant Examiner* — Mark Tsidulko
(74) *Attorney, Agent, or Firm* — Oliff PLC

(57) ABSTRACT

An illuminating apparatus includes: a light source, and a lens sheet arranged on an optical axis of the light source on which a plurality of prisms arranged in concentric circles centered on the optical axis of the light source are formed. A light diffusing part including a plurality of hemispherical light scattering elements is provided on the lens sheet, the light diffusing part includes light scattering elements whose shape is distorted due to influence of light scattering elements that are adjacent in at least one direction, and the plurality of light scattering elements is arranged in concentric circles centered on the optical axis of the light source.

9 Claims, 4 Drawing Sheets

(56) References Cited

U.S. PATENT DOCUMENTS

| | | | |
|---|---|---|---|
| 7,559,681 B2 * | 7/2009 | Suehiro et al. | 362/558 |
| 7,565,744 B2 * | 7/2009 | Matsui et al. | 29/890.131 |
| 8,070,345 B2 * | 12/2011 | Zhang et al. | 362/619 |
| 8,212,963 B2 * | 7/2012 | Sikiguchi et al. | 349/64 |
| 8,220,975 B2 * | 7/2012 | Miyashita et al. | 362/340 |
| 8,783,890 B2 * | 7/2014 | Kasai | 362/97.2 |
| 8,866,977 B2 * | 10/2014 | Sawado | 349/5 |
| 2011/0317414 A1 | 12/2011 | Marfeld et al. | |

* cited by examiner

ILLUMINATING APPARATUS AND METHOD OF PRODUCING LENS SHEET USED THEREIN

BACKGROUND OF THE INVENTION

1. Field of the Invention

The present invention relates to an illuminating apparatus and a method of producing a lens sheet used therein.

2. Description of the Related Art

Conventionally, incandescent lamps or fluorescent lamps have been generally used as a light source for general illumination such as indoor lighting. However, in accordance with current technological advances in blue light-emitting diodes (LEDs), LEDs are now used as light sources for ceiling lights, down lights, and the like. See Japanese Patent Application Laid-Open No. 2007-220465.

FIG. 4 illustrates a so-called quasi-white-light source 100 which can be used as a light source for an illuminating apparatus. The quasi-white-light source 100 includes a lamp house 104 in which blue light-emitting LEDs, which serve as a plurality of light-emitting element chips 102a that constitute a light-emitting element 102, are arranged near each other on a bottom part, and a transparent resin 106 that seals a recessed part of the lamp house 104. In the transparent resin 106, yellow fluorescent bodies such as garnet (YAG) are dispersed as fluorescent bodies 108. Blue light that is emitted from the blue light-emitting LEDs 102a diffuses within the transparent resin 106 of the lamp house 104, and therein it is wavelength converted to yellow fluorescent light by the yellow fluorescent bodies 108 and emitted in this state to the outside of the lamp house 104 as emitted light L (L1, L2) indicated by dash-dot-dot lines for convenience. The portion indicated by reference numeral 103 in FIG. 4 is an electrode terminal.

The light L emitted from the quasi-white-light source 100 is deflected towards the necessary direction by passing through, for example, a lens sheet having a plurality of prisms that is disposed toward the front on an optical axis C of the quasi-white-light source 100, and thereby it functions as an illuminating apparatus.

However, light emitted from an illuminating apparatus using the quasi-white-light source 100 described above as a light source tends to exhibit slightly blue color in the center and slightly yellow color at the outer edges relative to the optical axis C of the quasi-white-light source 100. This is due to the following reason. In the emitted light indicated by L2 in FIG. 4 which travels along an optical path that is inclined relative to the optical axis C of the quasi-white-light source 100, the length of the optical path that passes through the transparent resin 106 in which the yellow fluorescent bodies 108 are dispersed is longer than the emitted light indicated by L1 in FIG. 4. The proportion of wavelength converted to yellow fluorescent light by the yellow fluorescent bodies 108 is thus larger compared to the emitted light indicated by L1. Here, L1 travels along an optical path that is parallel to the optical axis C of the quasi-white-light source 100.

Further, in light emitted from an illuminating apparatus using the quasi-white-light source 100, which has a plurality of blue light-emitting LEDs 102 arranged near each other as described above, as a light source, there are cases in which color unevenness called "chip appearance" occurs on the illuminated surface. This occurs because light with strong blue color and high brightness among the light emitted from the blue light-emitting LEDs 102a lines up together on the illuminated surface, and it is a phenomenon that is visually recognizable.

Thus, as a measure for overcoming the color unevenness mentioned above, there are cases in which a light diffusing part including a plurality of light scattering elements is provided on a surface opposite to the surface on which a plurality of prisms are formed of the lens sheet disposed on the optical axis C of the quasi-white-light source 100 (for example, refer to JP-A No. 2009-158473).

The light scattering elements can be fabricated comparatively easily by pressing an indenter to a surface of a mold matrix for injection molding a lens sheet (for example, refer to JP-A No. 11-53922). For example, when forming hemispherical light scattering elements on a lens sheet, as shown in FIG. 5, an indenter with a hemispherical tip is pressed to a surface of a mold matrix 120 for injection molding the lens sheet to form hemispherical recesses 122 utilizing the plastic deformation of the mold matrix 120. By injection molding a resin using the mold matrix 120 on which a plurality of the recesses 122 have been formed across a predetermined range, a lens sheet in which a plurality of hemispherical projections (light scattering elements) corresponding to the recesses 122 are formed across a predetermined range can be molded.

However, if the area density of the recesses 122 (area in which the recesses 122 are formed per unit area) is increased in order to achieve a greater light scattering effect by the light scattering elements of the lens sheet, when fabricating the plurality of recesses 122 by pressing the indenter to the mold matrix 120, the recesses 122 that are adjacent affect each other. In particular, the shape of recesses 122 which have already been fabricated is greatly distorted by the recesses 122 which are subsequently fabricated. Therefore, when providing the plurality of hemispherical recesses 122 in a lattice pattern at equal intervals horizontally and vertically, if the plurality of recesses 122 are fabricated in order by row or column units which constitute the lattice, the above-mentioned shape distortions become aligned in one direction and the shape distortions are reflected (transferred by injection molding) in the light scattering elements of the lens sheet. Thus, if such a lens sheet is used in an illuminating apparatus, the shape distortions aligned in one direction of the light scattering elements influence the light scattering effect by the light scattering elements and unidirectional anisotropy (or deviation of illuminated light) occurs in the light from the illuminating apparatus, and this provides negative influence to the rotational symmetry.

Further, in order to suppress the unidirectional anisotropy, a method has been proposed in which the plurality of recesses 122 are sequentially fabricated in a lattice-type spiral pattern originating from a recess 122x, which corresponds to the light scattering element positioned center of the lens sheet ((that is, on the optical axis C)), as shown by the dashed line arrows in FIG. 5.

However, even if the recesses 122 are fabricated according to this method, adjacent recesses 122 still affect each other, leading to the shape distortions described above, and shape anisotropy (four-fold rotational symmetry) appears in each of four regions divided by the two diagonal lines XX' and YY' shown in FIG. 5. In other words, excluding the recess 122x positioned center, the shapes of the recesses 122 on the two diagonal lines XX' and YY' are distorted due to the significant influence from three recesses 122 that are subsequently fabricated, whereas the shapes of the recesses that are not on the two diagonal lines XX' and YY' are distorted due to the significant influence from two recesses 122 that are subsequently fabricated. Further, the location (direction) which is influenced by the two recesses 122 that are subsequently fabricated is different in each of the four regions for the recesses 122 that are not on the two diagonal lines XX' and YY'. Therefore, in the lens sheet molded from the mold matrix 120, anisotropy in each of the four regions occurs in the light scattering effect by the light scattering elements, and this may be visually recognizable as boundary lines or light/dark differences in the illuminated light.

SUMMARY OF THE INVENTION

Considering the above problems, an object of the present invention is to reduce color unevenness in the illuminated light of an illuminating apparatus without losing any brightness.

The below-described embodiments exemplify constitutions of the present invention, and will be explained in an itemized manner in order to facilitate the understanding of the various constitutions of the present invention. Each aspect is not meant to limit the technical scope of the present invention, and substitutions or deletions of a portion of the constituent elements of each aspect as well as additions of other constituent elements upon referring to the detailed description of the preferred embodiments are included within the technical scope of the invention.

According to a first aspect of the invention, there is provided an illuminating apparatus including: a light source, and a lens sheet that is arranged on an optical axis of the light source and that has a plurality of prisms concentrically arranged with the optical axis of the light source positioned center, wherein a light diffusing part including a plurality of hemispherical light scattering elements is provided on the lens sheet, the light diffusing part includes the light scattering elements whose shapes are distorted at least in one direction due to influence of adjacent light scattering elements, and the plurality of light scattering elements are concentrically arranged with the optical axis of the light source positioned center.

With this structure, the illuminating apparatus includes a light source and a lens sheet arranged on an optical axis of the light source, and a plurality of prisms concentrically arranged with the optical axis of the light source positioned center are formed on the lens sheet. Further, a light diffusing part including a plurality of hemispherical light scattering elements is provided on the lens sheet, and the light diffusing part includes light scattering elements whose shape is distorted due to influence of light scattering elements that are adjacent in at least one direction.

Here, the reason that light scattering elements whose shape is distorted are included in the plurality of light scattering elements that constitute the light diffusing part is as follows. The lens sheet of the illuminating apparatus according to the above structure is molded by injection molding, and a plurality of hemispherical recesses corresponding to the plurality of light scattering elements of the lens sheet are fabricable, for example, by pressing an indenter on a surface of a mold matrix used in the injection molding. Although details are omitted, the recesses on the surface of the mold matrix are formable by any other methods such as through application of laser beams to the surface of the mold matrix. When fabricating the recesses, if the recesses are fabricated on the mold matrix in conformity with the area density of the light scattering elements formed on the lens sheet, in regions in which the area density is large, the shape of the recesses which have already been fabricated is distorted due to influence of plastic deformation of the mold matrix when adjacent recesses which are subsequently fabricated are formed. Therefore, light scattering elements whose shape is distorted are also formed in the lens sheet molded using the mold matrix in which such recesses have been fabricated.

However, in the lens sheet according to the above structure, the plurality of light scattering elements are concentrically arranged with the optical axis of the light source positioned center. Therefore, by fabricating the recesses on the surface of the mold matrix in annular rows of recesses corresponding to annular rows of the plurality of light scattering elements, the distortions of the recesses become aligned in the circumferential direction. Thereby, the plurality of light scattering elements of the lens sheet are also formed such that the shape distortions are aligned in the circumferential direction. Therefore, even though there are distortions in the shape, the occurrence of boundary lines or light/dark differences in the illuminated light caused by such shape distortions can be avoided regardless of whether the area density of the light scattering elements is large. Thus, light emitted from the light source is scattered by the plurality of light scattering elements disposed at a high density without any significant influence from the shape distortions, and thereby color unevenness is reduced without losing any brightness of the illuminated light of the illuminating apparatus.

In addition, both the plurality of prisms and the plurality of light scattering elements formed on the lens sheet are concentrically arranged with the optical axis of the light source positioned center, and thus light distribution exhibiting excellent rotational symmetry can be realized.

In the first aspect, the light diffusing part includes the following three types of light scattering elements with different shapes in each annular row of the plurality of light scattering elements concentrically arranged: one first light scattering element, one second light scattering element, and a plurality of third light scattering elements, and each of the first light scattering elements is configured to dispose as not being continuously arranged in a radial direction.

With this structure, the light diffusing part provided on the lens sheet includes the following three types of light scattering elements in each annular row of the plurality of light scattering elements concentrically arranged: one first light scattering element, one second light scattering element, and a plurality of third light scattering elements. The three types of light scattering elements are determined depending on the fabrication order within the annular rows of the plurality of recesses fabricated on the surface of the mold matrix. In this explanation, the light scattering element formed by the recess which is fabricated first in each annular row of recesses is referred to as the first light scattering element, the light scattering element formed by the recess which is fabricated last in each annular row of recesses is referred to as the second light scattering element, and the light scattering elements formed by the other recesses in each annular row of recesses are referred to as the third light scattering elements. As described above, the shape of the recesses that have already been fabricated is distorted due to influence of plastic deformation of the mold matrix when molding the recesses, but since the number of adjacent recesses that are subsequently fabricated is different, the degree of influence in each of the three types of light scattering elements is different and thus their shapes are also different.

Also, with this structure, each of the first light scattering elements included in the annular rows of the plurality of light scattering elements is configured to dispose such that multiple first light scattering elements are not continuously arranged in a radial direction. Further, the first light scattering elements formed by the recesses that are fabricated first in each annular row of recesses are disposed so that they are not continuous relative to the radial direction, and thus the second light scattering elements formed by the recesses that are fabricated last in each annular row of recesses are also disposed so that they are not continuously arranged in a radial direction. Therefore, while scattering light emitted from the light source with the plurality of light scattering elements, any decreases in uniformity of illuminated light for disposing the first and second light scattering elements are also avoidable. Here, the first and second light scattering elements have different shapes compared to the plurality of third light scattering elements that are continuously arranged in a radial direction.

In the first aspect, the plurality of light scattering elements concentrically form a plurality of light scattering element groups in each annular row, each of the plurality of light scattering element groups includes the first light scattering element whose shape is distorted in two directions due to influence of the adjacent light scattering elements within the light scattering element group, the second light scattering element arranged adjacent to the first light scattering element, and the third light scattering elements whose shapes are distorted in one direction due to influence of the adjacent light scattering element within the light scattering group, and the first light scattering elements are disposed each randomly within the light diffusing part.

With this structure, the plurality of light scattering elements that constitute the light diffusing part form a plurality of light scattering element groups in each of annular rows concentrically arranged, and each light scattering element group includes one first light scattering element, one second light scattering element, and a plurality of third light scattering elements. The shape of the first light scattering element is distorted due to the significant influence of the light scattering elements that are adjacent in two directions within the light scattering element group. In other words, the first light scattering element is formed by the recess that was fabricated first and whose shape is distorted due to the significant influence of the recess that was fabricated second and the recess that was fabricated last in each annular row of recesses of the mold matrix, and thus the shape of the first light scattering element is distorted due to significant influence from two directions (the forward and reverse direction when viewed in the circumferential direction). Also, the second light scattering element is formed by the recess that was fabricated last and is adjacent to the recess that was fabricated first (the first light scattering element) in each annular row of recesses of the mold matrix, and thus the degree to which the second light scattering element is influenced by the plastic deformation of the mold matrix when the other recesses are fabricated is the smallest among the first to third light scattering elements. In addition, the shape of each third light scattering element is distorted due to the significant influence of the light scattering element that is adjacent in one direction within the light scattering group. In other words, each of the third light scattering elements is formed by a recess whose shape is distorted due to the significant influence of the recess fabricated immediately afterward in each annular row of recesses of the mold matrix, and thus the shape of each third light scattering element is distorted due to significant influence from one direction (the forward direction or the reverse direction when viewed in the circumferential direction).

Also, each of the first light scattering elements is arranged randomly within the light diffusing part, and they are thus not continuously arranged in a radial direction. Thereby, the second light scattering elements that are adjacent to the first light scattering elements are also not disposed continuously in a radial direction. Therefore, similar to the illuminating apparatus according to the first aspect, while scattering the light emitted from the light source with the plurality of light scattering elements, any decreases in uniformity of illuminated light for disposing the first and second light scattering elements are also avoidable. Here, the first and second light scattering elements have different shapes compared to the plurality of third light scattering elements which occupy a majority of the light scattering elements within the light diffusing part, the third light scattering elements being continuously arranged in a radial direction.

In the first aspect, the light diffusing part includes an annular region.

With this structure, the light diffusing part including the plurality of light scattering elements includes an annular region, and, for example, the plurality of light scattering elements concentrically arranged with the optical axis of the light source positioned center are not formed on the periphery of the optical axis of the light source but are formed in the annular region around the periphery of the optical axis. Alternatively, the plurality of light scattering elements can be formed in a circular region on the periphery of the optical axis of the light source, and also in an annular region disposed at an interval from the outer periphery of the circular region. In other words, the annular rows of the plurality of light scattering elements concentrically arranged with the optical axis of the light source positioned center are disposed in a necessary number of rows at necessary locations, and thus light emitted from the light source is scattered efficiently.

In the first aspect, in the annular rows of the plurality of light scattering elements concentrically arranged, the arrangement intervals of the plurality of light scattering elements differ in accordance with a distance from the optical axis of the light source.

With this structure, in the annular rows of the plurality of light scattering elements concentrically arranged, the arrangement intervals of the plurality of light scattering elements in each row differ in accordance with a distance from the optical axis of the light source. In other words, in each annular row of the plurality of light scattering elements, the plurality of light scattering elements are arranged at an appropriate density in accordance with the distance from the optical axis of the light source, and thus the light emitted from the light source is efficiently scattered.

In the first aspect, the plurality of prisms and the light diffusing part are formed on different surfaces of the lens sheet.

With this structure, the plurality of prisms concentrically arranged and the plurality of light scattering elements that constitute the light diffusing part are formed on different surfaces of the lens sheet. Thereby, for example, if the lens sheet is disposed such that the surface on which the plurality of prisms are formed faces the light source, the optical path of light emitted from the light source is deflected by the deflection action according to the shape of each of the plurality of prisms on the surface of the lens sheet that faces the light source. Further, the light whose optical path has been deflected proceeds through the lens sheet and then is scattered at various angles by the plurality of light scattering elements that constitute the light diffusing part on the surface of the lens sheet that is on the opposite side of the light source so that its directivity is decreased, and finally the light is emitted from the lens sheet. Therefore, the color mixing of light emitted from the light source that is emitted through the lens sheet is promoted, and thus the color unevenness is reduced without losing any brightness of the illuminated light of the illuminating apparatus.

In the first aspect, the plurality of prisms and the light diffusing part are formed on the same surface of the lens sheet.

With this structure, the plurality of prisms and the light diffusing part are formed on the same surface of the lens sheet. For example, in the region on the periphery of the optical axis of the light source of the lens sheet, the plurality of light scattering elements that constitutes the light diffusing part can be concentrically arranged with the optical axis of the light source positioned center, and in the region on the outer circumferential side of the lens sheet, the plurality of prisms can be concentrically arranged with the optical axis of the light source positioned center. In other words, the plurality of light scattering elements or the plurality of prisms are arranged in a region deemed necessary in accordance with the distance from the optical axis of the light source. Thereby, the optical path of light emitted from the light source is deflected by the prisms in the region in which the plurality of prisms are formed, and the light is scattered in various directions by the light scattering elements in the region in which the light diffusing part is formed, and thus color unevenness is efficiently reduced.

In the first aspect, the plurality of prisms is formed on both surfaces of the lens sheet, and the light diffusing part is formed on one surface of the lens sheet.

With this structure, the plurality of prisms concentrically arranged are formed on both surfaces of the lens sheet, and the plurality of light scattering elements that constitute the light diffusing part are formed on one surface of the lens sheet. Thereby, for example, if the lens sheet is disposed so that the surface on which the light diffusing part is provided is facing the opposite side of the light source, the optical path of light emitted from the light source is deflected by the deflection action according to the shape of each of the plurality of prisms on the surface of the lens sheet that faces the light source. Further, the light whose optical path has been deflected proceeds through the lens sheet, and then on the surface of the lens sheet that is on the opposite side of the light source, light that passes through the region in which the light diffusing part is provided is scattered at various angles by the light scattering elements and the optical path of light that passes through the region in which the plurality of prisms are formed is deflected by the deflection action according to the shape of each of the prisms, and finally the light is emitted from the lens sheet. Therefore, the color mixing of light emitted from the light source is promoted, and thus the color unevenness is reduced without losing any brightness of the illuminated light of the illuminating apparatus.

In the first aspect, the light source is a white light source including a light emitting element and a fluorescent body that emits fluorescent light with light that has been emitted from the light emitting element.

With this structure, the light source is a quasi-white-light source including a light emitting element and a fluorescent body that receives light emitted from the light emitting element and wavelength converts it to emit fluorescent light. As described above, light emitted from the white light source is scattered by the plurality of light scattering elements of the light diffusing part, and thus unavoidable color unevenness in the quasi-white-light source is reduced.

In the first aspect, the light emitting element is constituted by a plurality of light emitting element chips arranged near each other.

With this structure, the light emitting element of the white light source is constituted by a plurality of light emitting element chips arranged near each other. In this kind of white light source, there is a concern that color unevenness called "chip appearance" may occur. However, with this structure, since light emitted from the white light source is scattered by the plurality of light scattering elements of the light diffusing part as described above, such color unevenness is also reduced.

According to a second aspect of the invention, there is provided a method for producing a lens sheet including a plurality of prisms concentrically arranged and a light diffusing part with a plurality of hemispherical light scattering elements concentrically arranged, the method comprising the steps of pressing an indenter on a surface of a mold matrix; and forming a plurality of recesses on the surface of the mold matrix, each annular row of the plurality of recesses being adapted to correspond to each annular row of the plurality of light scattering elements concentrically arranged.

With this structure, the method for producing the lens sheet is a method for producing a lens sheet including a plurality of prisms concentrically arranged and a light diffusing part including a plurality of hemispherical light scattering elements concentrically arranged. In this method, a plurality of recesses corresponding to the plurality of light scattering elements formed on the lens sheet are fabricated by pressing an indenter on the surface of a mold matrix for molding the lens sheet. When doing so, the recesses are fabricated by pressing the indenter in each annular row of the plurality of recesses corresponding to an annular row of the plurality of light scattering elements concentrically arranged on the lens sheet. Thereby, even though the shape of the recesses that have already been fabricated is distorted due to influence of adjacent recesses which are subsequently fabricated, the distortion of the recesses becomes aligned in the circumferential direction even if the area density of the recesses is large. Therefore, in a lens sheet molded using such a mold matrix, the plurality of light scattering elements are formed such that shape distortions therein are aligned in the circumferential direction. Thus, if a lens sheet produced by the method for producing a lens sheet described above is used in an illuminating apparatus, light emitted from the light source is scattered by the plurality of light scattering elements disposed at a high density without any significant influence from the shape distortions, and thereby color unevenness is reduced without losing any brightness of the illuminated light of the illuminating apparatus.

In the second aspect, a position at which the indenter is pressed first in each annular row formed with the plurality of recesses is randomly set.

With this structure, in the method for producing a lens sheet, when fabricating the recesses by pressing the indenter in each annular row of the plurality of recesses, the position at which the indenter is first pressed is randomly set in each annular row of recesses. Thereby, the recess which is fabricated first in each annular row of recesses is fabricated at a position such that it is not arranged continuously in a radial direction with the recesses which are fabricated first in the other annular rows of recesses. Accordingly, the recess which is fabricated last and is adjacent to the recess which is fabricated first in each annular row of recesses is also fabricated at a position such that it is not continuous in the radial direction with the recesses which are fabricated last in the other annular rows. Therefore, in a lens sheet molded using a mold matrix in which the recesses are fabricated as described above, the light scattering elements formed by the recesses which are fabricated first and the light scattering elements which are formed by the recesses which are fabricated last, which have different shapes compared to the other light scattering elements that occupy a majority of the light scattering elements within the light diffusing part, are disposed such that they are not continuous in the radial direction. Thus, when such a lens sheet is used in an illuminating apparatus, any decreases in uniformity of illuminated light for disposing the light scattering elements are also avoidable because having different shapes compared to the light scattering elements that occupy a majority of light diffusing part such that they are continuously arranged in a radial direction.

In the second aspect, the annular rows of the plurality of recesses arranged concentrically are formed sequentially from a center toward an outer circumference.

With this structure, in the method for producing a lens sheet, when fabricating the recesses by pressing the indenter in each annular row of the plurality of recesses concentrically arranged on the surface of the mold matrix, the annular rows of recesses are sequentially fabricated from the annular row of recesses positioned most at the center toward the outer circumferential direction. Thereby, even though the shape of the recesses that have already been fabricated is distorted due to influence of radially adjacent recesses which are subsequently fabricated, the distortion of the recesses becomes aligned on the outer circumferential side in the radial direction even if the area density of the recesses is large, and the plurality of recesses is fabricated efficiently.

With the above-described structures, it is possible to reduce color unevenness without losing any brightness of the illuminated light of the illuminating apparatus.

DETAILED DESCRIPTION OF THE PREFERRED EMBODIMENTS

Figure 1:
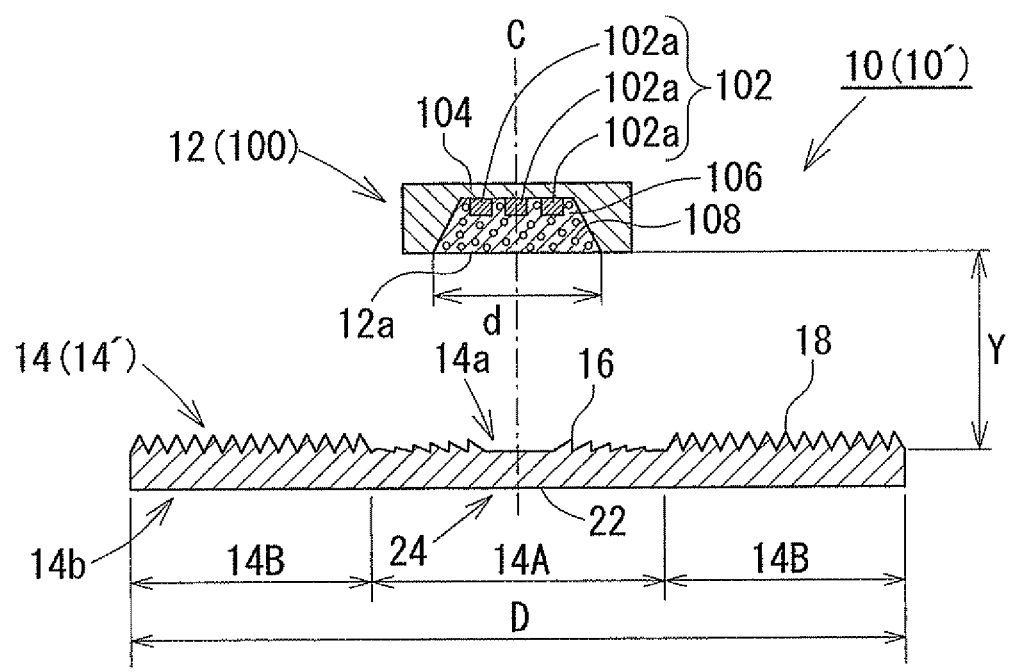
FIG. 1 is a cross-section view schematically illustrating a structure of an illuminating apparatus according to first and second embodiments of the present invention.

Embodiments of the present invention will be explained below referring to the attached drawings. Here, portions which are the identical to or correspond to the conventional technology will be assigned the same reference numerals and detailed explanations thereof will be omitted.

Figure 4:
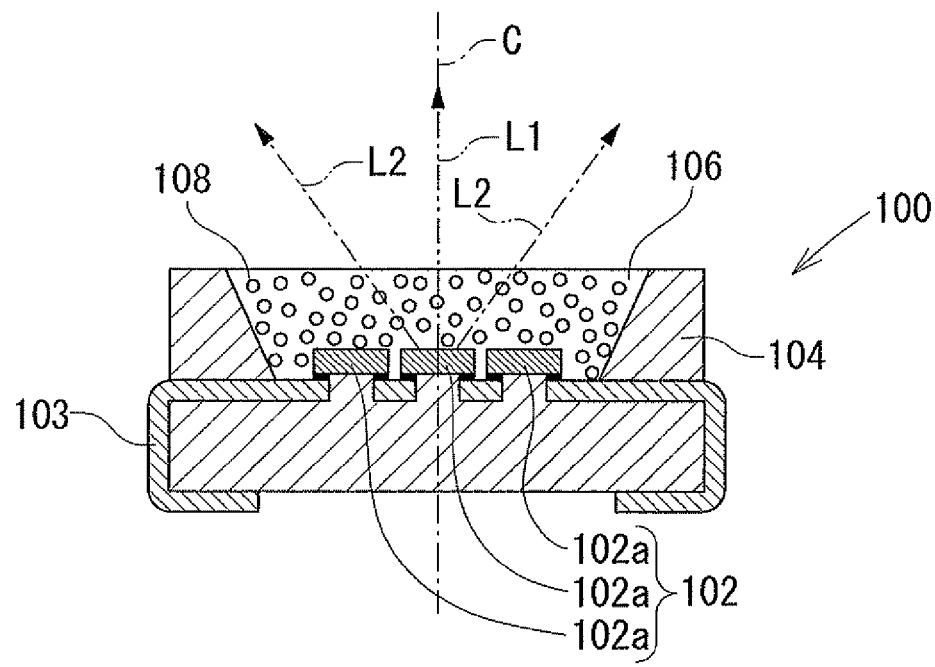
FIG. 4 is a cross-section view illustrating a quasi-white-light source and light emitted therefrom.
Figure 5:
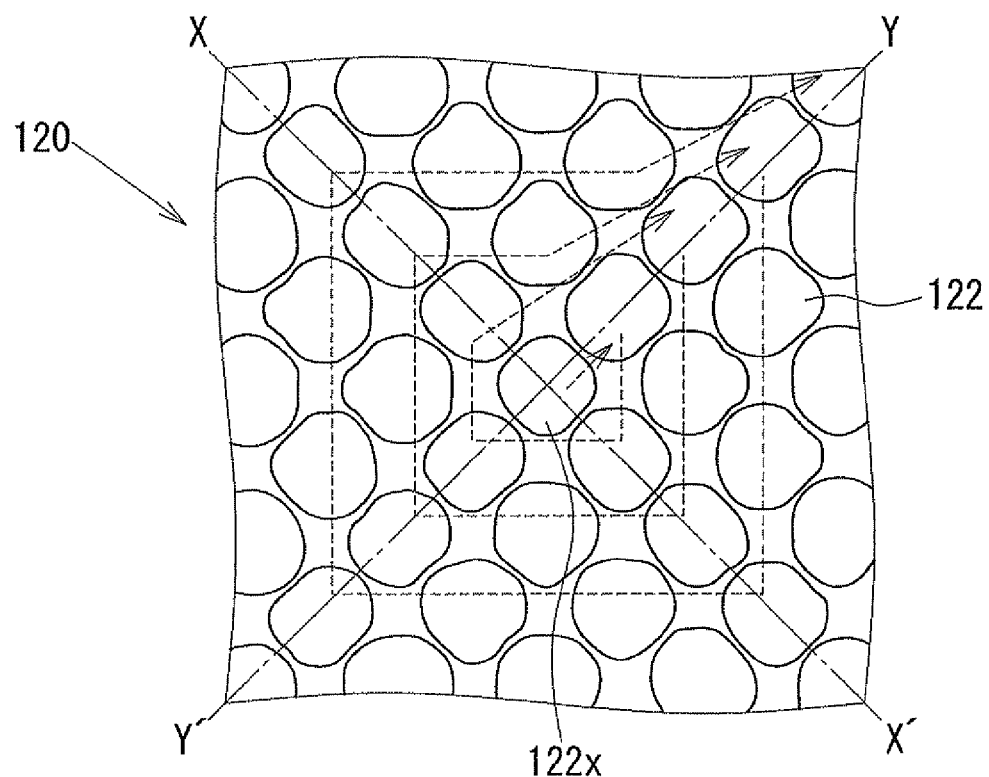
FIG. 5 is a partial cross-section view of a mold matrix for molding a lens sheet of a conventional illuminating apparatus.

As shown in FIG. 1, an illuminating apparatus 10 according to the first embodiment of the present invention includes a light source 12 and a lens sheet 14. The lens sheet 14 includes a plurality of prisms 16 and 18 concentrically arranged with an optical axis C of the light source 12 positioned center. The light source 12 has the structure of the quasi-white-light source 100 identical to that of the conventional technology shown in FIG. 4, and the structures therein are assigned the same reference numerals used in FIG. 4. In the example of FIG. 1, as the light source 12, a quasi-white-light source including a light emitting element 102 constituted by three light emitting element chips (blue light emitting LEDs) 102a is illustrated. However, in the light source 12 of the illuminating apparatus 10 according to the present embodiment, the number of light emitting element chips 102a is set between 3 and several tens, and the pitch of the arrangement thereof is set to approximately 0.25 mm.

The lens sheet 14 is formed in a disc shape in which the optical axis C of the light source 12 is its center, and the lens sheet 14 is disposed in front (in the light emitting direction) of a light emitting surface 12a of the light source 12. In the example of FIG. 1, on a surface 14a of the lens sheet 14 that faces the light source 12, a first lens group 14A disposed on the inside using the optical axis C of the light source 12 as a reference position and a second lens group 14B disposed on the outside of the first lens group 14A are formed. The first lens group 14A includes a plurality of prisms 16 having an inclined surface that is inclined toward the optical axis C side of the light source 12. The second lens group 14B includes a plurality of reflecting prisms 18. In this way, in the illuminating apparatus 10 according to the present embodiment, the plurality of prisms concentrically arranged on the lens sheet 14 can include various prisms.

On a surface 14b of the lens sheet 14 on the opposite side of the light source 12, a light diffusing part 24 including a plurality of hemispherical light scattering elements 22 is provided. The plurality of light scattering elements 22 are concentrically arranged with the optical axis C of the light source 12 positioned center. The details of the light diffusing part 24 will be explained below.

Further, the illuminating apparatus 10 is constituted by including a bowl-shaped or closed-ended-cylinder-shaped reflective mirror (not illustrated) that integrally covers the outer edges of the light source 12 and the lens sheet 14.

A distance Y between the light emitting surface 12a of the light source 12 and the surface 14a of the lens sheet 14 on the opposite side of the light source 12 is set to be approximately the same as the diameter d of the light emitting surface 12a of the light source 12 in the first embodiment of the present invention, but it is preferably set to a range of 0.5d≤Y≤1.5d from the perspectives of reducing color unevenness without losing any brightness of the illuminated light of the illuminating apparatus 10 and promoting the size reduction of the illuminating apparatus 10. From the same perspectives, the diameter D of the lens sheet 14 is preferably set to $TAN^{-1}(D/2Y)<80°$. As one example of the size of the lens sheet 14, the diameter D is 70 mm and the thickness (length in the up-down direction in FIG. 1) is approximately 1 mm. The numerical values of the distance Y and the diameter D given here are suitable values for the lens sheet 14 of the embodiment shown in FIG. 1, and do not limit the values that can be utilized in the illuminating apparatus of the present invention. The values of the distance Y and the diameter D and the like can be set to appropriate values in accordance with the surfaces and regions of the lens sheet 14 in which the plurality of prisms 16 and 18 and the plurality of light scattering elements 22 are formed.

Next, referring to FIG. 2A, the light diffusing part 24 provided on the surface 14b of the lens sheet 14 on the opposite side of the light source 12 will be explained in detail. As explained above, the light diffusing part 24 includes a plurality of hemispherical light scattering elements 22 concentrically arranged with the optical axis C of the light source 12 positioned center. The plurality of light scattering elements 22 form a light scattering element group 26 (26a, 26b, 26c . . . ) in each annular row concentrically arranged, except for a light scattering element 22x positioned center on the optical axis C of the light source 12. As can also be confirmed from FIG. 2A, each of the plurality of light scattering elements 22 does not have perfectly circular shapes in a plan view, and the circular shapes are distorted due to influence of adjacent light scattering elements.

Here, in order to explain the shape distortions of the light scattering elements 22, the method of producing the lens sheet 14 should be mentioned. The lens sheet 14 is produced by an injection molding method. FIG. 2B is a partial illustration from a plan view direction of a surface of a mold matrix 30 for forming the surface 14b of the lens sheet 14 on the opposite side of the light source 12 that is used when injection molding the lens sheet 14. As shown in FIG. 2B, on the surface of the mold matrix 30, a plurality of recesses 32 for forming the plurality of hemispherical light scattering elements 22 that constitute the light diffusing part 24 of the lens sheet 14 are fabricated by pressing an indenter with a hemispherical tip. Here, needless to say, the formation of the recesses 32 is not limited to the method using the indenter. However, the recesses 32 are formable through, for example, application of laser beams to the surface of the mold matrix 30. Note that any alternative method including the laser is applicable not only to the first embodiment but also to the second embodiment to be described hereinbelow.

The recess indicated by reference numeral 32x in FIG. 2B is a recess for forming the light scattering element 22x positioned center on the optical axis C of the light source 12. Therefore, the plurality of recess 32 for forming the plurality of light scattering elements 22 concentrically arranged on the lens sheet 14 are provided in a concentric manner with the recess 32x as its center, and form a plurality of annular rows 36 (36a, 36b, 36c . . . ).

However, as can be confirmed from FIG. 2B, each of the plurality of recesses 32 does not have perfectly circular shapes in a plan view and is distorted, despite being fabricated by press of an indenter with a hemispherical tip. The reason for this is as follows: since the area density of the plurality of light scattering elements 22 formed on the lens sheet 14 is large, when the plurality of recesses 32 are fabricated for satisfying the area density of the plurality of light scattering elements 22, the shape of the recesses 32 that have already been fabricated becomes distorted due to influence of the plastic deformation of the mold matrix 30 when pressing the indenter. Here, each distorted location of the adjacent recesses 32 is next to a location to which the indenter is pressed. Due to such shape distortions, each of the plurality of recesses 32 has a shape different depending on the order of the fabrication.

In the example of FIG. 2B, the center recess 32x is the recess which is fabricated first, and thus its shape is distorted due to influence of the six surrounding recesses 32 which are subsequently fabricated.

Next, six recesses 32 that constitute the first annular row 36a of recesses are fabricated in the counterclockwise direction starting with a recess indicated by reference numeral 32a positioned on the top right in FIG. 2B of the center recess 32x. Upon confirming these six recesses 32, it can be understood that they can be divided into three types based on the pattern of shape distortion. The recess indicated by reference numeral 32a within the first annular row 36a of recesses is fabricated first in the row, and thus its shape is distorted due to influence of two recesses 32 that are subsequently fabricated: the recess 32 (32c) that is adjacent on the left side and the recess 32 (32b) that is adjacent on the lower right, which are positioned in the front and rear directions when viewed in the circumferential direction. In the present specification, this type of recess will be referred to as a "first recess 32a". The recess indicated by reference numeral 32b is fabricated last in the row, and thus it exhibits almost no shape distortion due to influence of the other adjacent recesses 32 in the row. In the present specification, this type of recess will be referred to as a "second recess 32b". The shapes of the other four recesses 32 besides the first recess 32a and the second recess 32b are distorted due to influence of a single recess 32 that is fabricated subsequently at a forward position in the counterclockwise direction when viewed in the circumferential direction. In the present specification, this type of recess will be referred to as a "third recess 32c".

Following the first annular row 36a of recesses, the recesses 32 that constitute the second annular row 36b of recesses are fabricated. In this case as well, first, the first recess 32a is fabricated first in the row, Next, a plurality of third recesses 32c are fabricated while distorting the shape of the recess 32 (32a or 32c) fabricated directly beforehand at a rearward position in the counterclockwise direction when viewed in the circumferential direction. Finally, the second recess 32b is fabricated while distorting the shapes of the third recess 32c at a rearward position in the counterclockwise direction and the first recess 32a at a forward position in the counterclockwise direction. Next, a plurality of recesses 32 that constitute the third and subsequent annular rows of recesses are also fabricated in the same way as the first and second rows.

In this way, a plurality of recesses 32 are fabricated in each annular row 36 of recesses from the annular row 36 of recesses at the center side toward the outer circumferential direction on the mold matrix 30 for molding the lens sheet 14 of the illuminating apparatus 10 according to the first embodiment of the present invention. In each annular row 36 of recesses, the following three types of recesses 32 having different shapes are fabricated: one first recess 32a, one second recess 32b, and a plurality of third recesses 32c. By fabricating the three types of recesses 32 having distorted shapes as described above, the shape distortions of the recesses 32 become aligned in the circumferential direction in each annular row 36 of recesses.

In the lens sheet 14 of the illuminating apparatus 10 according to the first embodiment of the present application molded using the mold matrix 30 as described above, the plurality of light scattering elements 22 that constitute the light diffusing part 24 are formed in shapes which copy the plurality of recesses 32 of the mold matrix 30. In other words, in each of the plurality of light scattering elements 22 of the lens sheet 14, the shape of the corresponding recess 32 among the plurality of recesses 32 of the mold matrix 30 is reflected exactly including the shape distortions. Therefore, as shown in FIG. 2A, on the surface 14b of the lens sheet 14 on the opposite side of the light source 12, the center light scattering element 22x corresponding to the center recess 32x of the mold matrix 30 is formed at the position of the optical axis C of the light source 12. Around the center light scattering element 22x, annular rows of the light scattering elements 22, i.e. the light scattering element groups 26, are formed over multiple rows centered on the optical axis C of the light source 12 corresponding to the annular rows 36 of recesses. In each of the plurality of light scattering elements groups 26, a first light scattering element 22a corresponding to the first recess 32a, a second light scattering element 22b corresponding to the second recess 32b, and a plurality of third light scattering elements 22c corresponding to the third recesses 32c are formed. Thereby, the plurality of light scattering elements 22 that constitute the light diffusing part 24 are formed so that their shape distortions are aligned in the circumferential direction in each of the plurality of light scattering element groups 26.

In the illuminating apparatus 10 according to the first embodiment of the present invention, the plurality of hemispherical light scattering elements 22 formed on the lens sheet 14 are not limited to hemispheres that protrude from the lens sheet 14, and can be formed as hemispheres that are recessed into the lens sheet 14. In the case that the lens sheet 14 is to be molded to have hemispherical light scattering elements 22 that protrude from the lens sheet 14, a mold cavity can be formed using the mold matrix 30 in which the plurality of recesses 32 are fabricated as shown in FIG. 2B as is to perform injection molding. On the other hand, in the ease that the lens sheet 14 is to be molded to have hemispherical light scattering elements 22 that are recessed into the lens sheet 14, for example, after forming a plating layer on the surface of the mold matrix 30 in which the plurality of recesses 32 are fabricated, the plating layer is separated from the mold matrix 30. Once separated, a plurality of protrusions whose shapes are an inversion of the shapes of the plurality of recesses 32 are formed on the plating layer. Thus, a mold cavity can be formed using the plating layer to perform injection molding.

According to the first embodiment of the present invention which has the structure described above, the following operational effects can be achieved. As shown in FIG. 1, the illuminating apparatus 10 according to the first embodiment of the present invention includes the light source 12 and the lens sheet 14 disposed on the optical axis C of the light source 12, and a plurality of prisms 16 and 18 concentrically arranged with the optical axis C of the light source 12 positioned center are formed on the surface 14a of the lens sheet 14 that faces the light source 12. Further, on the surface 14b of the lens sheet 14 on the opposite side of the light source 12, as shown in FIG. 2A, a light diffusing part 24 including a plurality of hemispherical light scattering elements 22 is provided, and the light diffusing part 24 includes light scattering elements 22 whose shape is distorted due to influence of light scattering elements 22 that are adjacent in at least one direction.

The reason that light scattering elements 22 whose shape is distorted are included in the plurality of light scattering elements 22 that constitute the light diffusing part 24 is as follows. As described above, the lens sheet 14 is molded by injection molding, and as shown in FIG. 2B, a plurality of hemispherical recesses 32 corresponding to the plurality of light scattering elements 22 of the lens sheet 14 are fabricated by pressing an indenter on a surface of the mold matrix 30 used for molding. When fabricating the recesses 32, if the recesses 32 are fabricated on the mold matrix 30 in conformity with the area density of the light scattering elements 22 formed on the lens sheet 14, since the area density is large, the shape of the recesses 32 which have already been fabricated is distorted due to influence of plastic deformation of the mold matrix 30 when adjacent recesses 32 which are subsequently fabricated are formed. Therefore, light scattering elements 22 whose shape is distorted are also formed in the lens sheet 14 molded using the mold matrix 30 in which such recesses 32 have been fabricated.

Figure 2A:
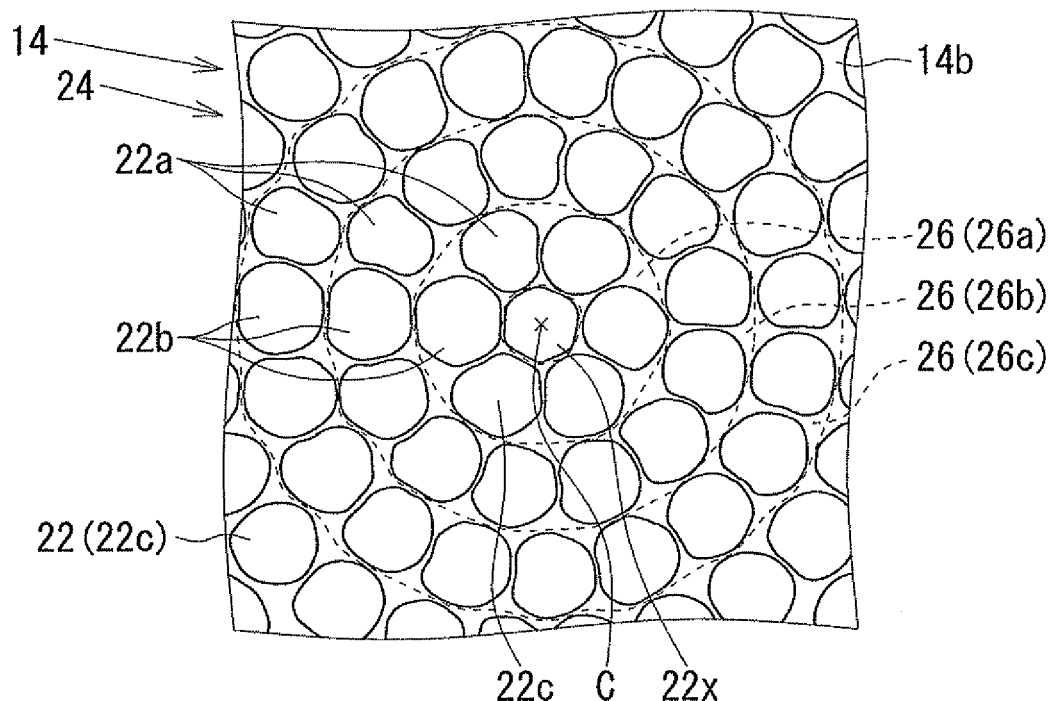
FIG. 2A is a plan view partially illustrating a light diffusing part provided on a lens sheet of the illuminating apparatus according to the first embodiment of the present invention.
Figure 2B:
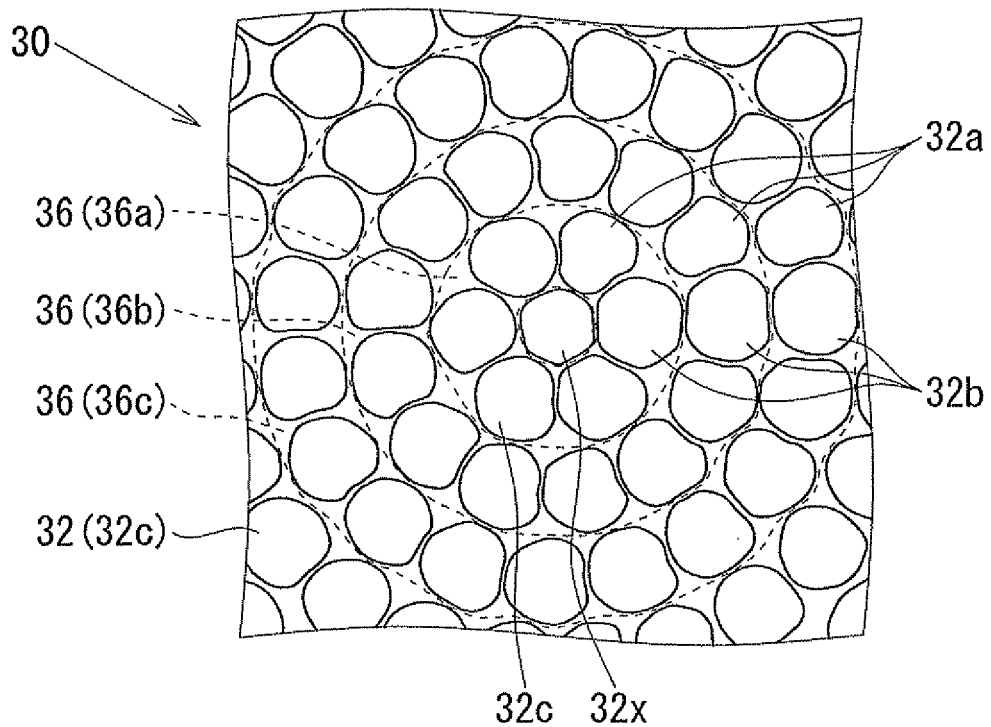
FIG. 2B is a partial plan view of a mold matrix for molding the lens sheet shown in FIG. 2A.

However, in the lens sheet 14 of the illuminating apparatus 10 according to the first embodiment of the present invention, as shown in FIG. 2A, the plurality of light scattering elements 22 are concentrically arranged with the optical axis C of the light source 12 positioned center. Therefore, by fabricating the recesses 32 on the surface of the mold matrix 30 in each annular rows 36 (36a, 36b, 36c ... ) of recesses shown in FIG. 2B corresponding to each the annular rows (26a, 26b, 26c ... ) of the plurality of light scattering elements 22, the distortions of the recesses 32 become aligned in the circumferential direction. Thereby, the plurality of light scattering elements 22 of the lens sheet 14 are also formed such that the shape distortions are aligned in the circumferential direction. Therefore, even though there are distortions in the shape, the occurrence of boundary lines or light/dark differences in the illuminated light caused by such shape distortions can be avoided regardless of whether the area density of the light scattering elements 22 is large. Thus, light emitted from the light source 12 can be scattered by the plurality of light scattering elements 22 disposed at a high density without any significant influence from the shape distortions, and thereby color unevenness can be reduced without losing any brightness of the illuminated light of the illuminating apparatus 10.

In addition, both the plurality of prisms 16 and 18 and the plurality of light scattering elements 22 formed in the lens sheet 14 are concentrically arranged with the optical axis C of the light source 12 positioned center, and thus light distribution exhibiting excellent rotational symmetry can be realized.

In the illuminating apparatus 10 according to the first embodiment of the present invention, as shown in FIG. 2A, the light diffusing part 24 provided on the lens sheet 14 includes the following three types of light scattering elements in each annular row (26) of the plurality of light scattering elements 22 concentrically arranged: one first light scattering element 22a, one second light scattering element 22b, and a plurality of third light scattering elements 22c. The three types of light scattering elements 22a to 22c are determined depending on the fabrication order within the annular rows 36 of the plurality of recesses fabricated on the surface of the mold matrix 30 shown in FIG. 2B. The light scattering element formed by the first recess 32a which is fabricated first in each annular row 36 of recesses is referred to as the first light scattering element 22a, the light scattering element formed by the second recess 32b which is fabricated last in each annular row 36 of recesses is referred to as the second light scattering element 22b, and the light scattering elements formed by the other third recesses 32c are referred to as the third light scattering elements 22c. As described above, the shape of the recesses 32 that have already been fabricated is distorted due to influence of plastic deformation of the mold matrix 30 when molding the recesses 32, but since the number of adjacent recesses 32 that are subsequently fabricated is different, the degree of influence in each of the first to third light scattering elements 22a to 22c is different and thus their shapes are also different. However, since the distortion directions of the first recess 32a, the second recess 32b, and the third recesses 32e are aligned in the circumferential direction, the distortion directions of the first to third light scattering elements 22a to 22c are also aligned in the circumferential direction. Therefore, light emitted from the light source 12 can be scattered by the plurality of light scattering elements 22 without any significant influence from the shape distortions, and thus color unevenness in the illuminated light can be reduced.

In the illuminating apparatus 10 according to the first embodiment of the present invention, the plurality of light scattering elements 22 that constitute the light diffusing part 24 can also form a plurality of light scattering element groups 26 in each of annular rows (26) concentrically arranged. In this case, as described above, each light scattering element group 26 includes one first light scattering element 22a, one second light scattering element 22b, and a plurality of third light scattering elements 22c. The shape of the first light scattering element 22a is distorted due to the significant influence of the light scattering elements that are adjacent in two directions within the light scattering element group 26. In other words, the first light scattering element 22a is formed by the first recess 32a that was fabricated first and whose shape is distorted due to the significant influence of the third recess 32e that was fabricated second and the second recess 32b that was fabricated last in each annular row 36 of recesses of the mold matrix 30, and thus the shape of the first light scattering element 22a is distorted due to significant influence from two directions (the forward and reverse direction when viewed in the circumferential direction). Also, the second light scattering element 22b is formed by the second recess 32b that was fabricated last and is adjacent to the first recess 32a (the first light scattering element 22a) that was fabricated first in each annular row 36 of recesses of the mold matrix 30, and thus the degree to which the second light scattering element 22b is influenced by the plastic deformation of the mold matrix 30 when the other recesses 32 are fabricated is the smallest among the first to third light scattering elements 22a to 22c.

In addition, the shape of each third light scattering element 22c is distorted due to the significant influence of the light scattering element that is adjacent in one direction within the light scattering element group 26, In other words, each of the third light scattering elements 22c is formed by a third recess 32c whose shape is distorted due to the significant influence of the recess 32 fabricated immediately afterward in each annular row 36 of recesses of the mold matrix 30, and thus the shape of each third light scattering element 22c is distorted due to significant influence from one direction (the forward direction going counterclockwise in the circumferential direction). However, even in this case, since the distortion directions of the first recess 32a, the second recess 32b, and the third recesses 32c are aligned in the circumferential direction, the distortion directions of the first to third light scattering elements 22a to 22c are also aligned in the circumferential direction. Therefore, light emitted from the light source 12 can be scattered by the plurality of light scattering elements 22 without any significant influence from the shape distortions, and thus color unevenness in the illuminated light can be reduced.

In the illuminating apparatus 10 according to the first embodiment of the present invention, the light diffusing part 24 including the plurality of light scattering elements 22 can include an annular region. For example, the plurality of light scattering elements 22 concentrically arranged with the optical axis C of the light source 12 positioned center are not formed on the periphery of the optical axis C of the light source 12 but are formed in the annular region around the periphery of the optical axis C. Alternatively, the plurality of light scattering elements 22 can be formed in a circular region on the periphery of the optical axis C of the light source 12, and also in an annular region disposed at an interval from the outer periphery of the circular region. In other words, the annular rows (26) of the plurality of light scattering elements 22 concentrically arranged with the optical axis C of the light source 12 positioned center can be disposed in a necessary number of rows at necessary locations, and thus light emitted from the light source 12 can be scattered efficiently.

In the illuminating apparatus 10 according to the first embodiment of the present invention, in each annular row (26) of the plurality of light scattering elements 22 concentrically arranged, the arrangement intervals of the plurality of light scattering elements 22 in the row can differ in accordance with the distance from the optical axis C of the light source 12. Thereby, in each annular row (26) of the plurality of light scattering elements 22, the plurality of light scattering elements 22 can be arranged at an appropriate density in accordance with the distance from the optical axis C of the light source 12, and thus the light emitted from the light source 12 can be efficiently scattered.

In the illuminating apparatus 10 according to the first embodiment of the present invention, as shown in FIG. 1, the plurality of prisms 16 and 18 concentrically arranged and the plurality of light scattering elements 22 that constitute the light diffusing part 24 are formed on the following different surfaces of the lens sheet 14: the surface 14a of the lens sheet 14 that faces the light source 12 and the surface 14b of the lens sheet 14 on the opposite side of the light source 12. Thereby, the optical path of light L emitted from the light source 12 is deflected by the deflection action according to the shape of each of the plurality of prisms 16 and 18 on the surface 14a of the lens sheet 14 that faces the light source 12. Further, the light whose optical path has been deflected proceeds through the lens sheet 14 and then is scattered at various angles by the plurality of light scattering elements 22 that constitute the light diffusing part 24 on the surface 14b of the lens sheet 14 that is on the opposite side of the light source 12 so that its directivity is decreased, and finally the light is emitted from the lens sheet 14. Therefore, the color mixing of light L emitted from the light source 12 that is emitted through the lens sheet 14 is promoted, and thus the color unevenness can be reduced without losing any brightness of the illuminated light of the illuminating apparatus 10.

In the illuminating apparatus 10 according to the first embodiment of the present invention, the plurality of various prisms such as the prisms 16 and 18 and the light diffusing part 24 can be formed on the same surface of the lens sheet 14. For example, the surface 14a of the lens sheet 14 that faces the light source 12 is a flat surface on which nothing is formed. On the surface 14b of the lens sheet 14 that is on the opposite side of the light source 12, in the region on the periphery of the optical axis C of the light source 12, the plurality of light scattering elements 22 that constitutes the light diffusing part 24 are concentrically arranged with the optical axis C of the light source 12 positioned center, and in the region on the outer circumferential side of the lens sheet 14, the plurality of various prisms are concentrically arranged with the optical axis C of the light source 12 positioned center. In other words, the plurality of light scattering elements 22 or the plurality of various prisms are arranged in a region deemed necessary in accordance with the distance from the optical axis C of the light source 12. Thereby, the optical path of light L emitted from the light source 12 is deflected by the prisms in the region in which the plurality of various prisms are formed, and the light is scattered in various directions by the light scattering elements 22 in the region in which the light diffusing part 24 is formed. Thus, color unevenness can be efficiently reduced in accordance with the distance from the optical axis C of the light source 12.

In the illuminating apparatus 10 according to the first embodiment of the present invention, the plurality of various prisms such as the prisms 16 and 18 concentrically arranged can be formed on the surface 14b of the lens sheet 14 that is on the opposite side of the light source 12 and on which the light diffusing part 24 is provided, and also can be formed on the surface 14a of the lens sheet 14 that faces the light source 12 and is opposite to the surface 14b. Thereby, the optical path of light L emitted from the light source 12 is deflected by the deflection action according to the shape of each of the plurality of various prisms on the surface 14a of the lens sheet 14 that faces the light source 12. Further, the light whose optical path has been deflected proceeds through the lens sheet 14, and then on the surface 14b of the lens sheet 14 that is on the opposite side of the light source 12, light that passes through the region in which the light diffusing part 24 is provided is scattered at various angles by the light scattering elements 22 and then emitted from the lens sheet 14, and the optical path of light that passes through the region in which the plurality of various prisms are formed is deflected by the deflection action according to the shape of each of the prisms and then emitted from the lens sheet 14. Therefore, in this case as well, the color mixing of light L emitted from the light source 12 is promoted, and thus the color unevenness can be reduced without losing any brightness of the illuminated light of the illuminating apparatus 10.

In other words, in the illuminating apparatus 10 according to the first embodiment of the present invention, the plurality of various prisms and the light diffusing part 24 formed on the lens sheet 14 can be formed on any surface and any region of the lens sheet 14, including the positions described in the above embodiment. Basically, on both the surface 14a of the lens sheet 14 that faces the light source 12 and the surface 14b of the lens sheet 14 that is on the opposite side of the light source 12, or either one of the surfaces 14a and 14b, prisms of an appropriate shape can be formed in regions in which a deflection action by the prisms is necessary, and the light diffusing part 24 can be formed in regions in which a scattering action by the light scattering elements 22 is necessary. By forming the plurality of various prisms and the light diffusing part 24 in this way, color unevenness of the illuminating apparatus 10 can be more effectively reduced.

In the illuminating apparatus 10 according to the first embodiment of the present invention, as shown in FIG. 1, the light source 12 is a quasi-white-light source including a light emitting element 102 and a fluorescent body 108 that receives light emitted from the light emitting element 102 and wavelength converts it to emit fluorescent light. As described above, light emitted from this white light source 12 is scattered by the plurality of light scattering elements 22 of the light diffusing part 24, and thus unavoidable color unevenness in the quasi-white-light source is reduced.

Further, the light emitting element 102 of the white light source 12 is constituted by a plurality of light emitting element chips 102a arranged near each other. In this kind of white light source 12, there is a concern that color unevenness called "chip appearance" may occur. However, in the illuminating apparatus 10 according to the first embodiment of the present invention, since light emitted from the white light source 12 is scattered by the plurality of light scattering elements 22 of the light diffusing part 24 as described above, such color unevenness is also reduced.

In the illuminating apparatus 10 according to the first embodiment of the present invention, as shown in FIG. 2B, when fabricating the recesses 32 by pressing the indenter in each annular row 36 of the plurality of recesses concentrically arranged on the surface of the mold matrix 30 used in the molding of the lens sheet 14, after fabricating the center recess 32x, the annular rows 36 of recesses are sequentially fabricated from the annular row 36a of recesses positioned around the center recess 32x toward the outer circumferential direction. Thereby, even though the shape of the recesses 32 that have already been fabricated is distorted due to influence of radially adjacent recesses 32 which are subsequently fabricated, the distortion of the recesses 32 becomes aligned on the outer circumferential side in the radial direction even if the area density of the recesses 32 is large in the radial direction, and the plurality of recesses 32 can be fabricated efficiently.

Figure 3A:
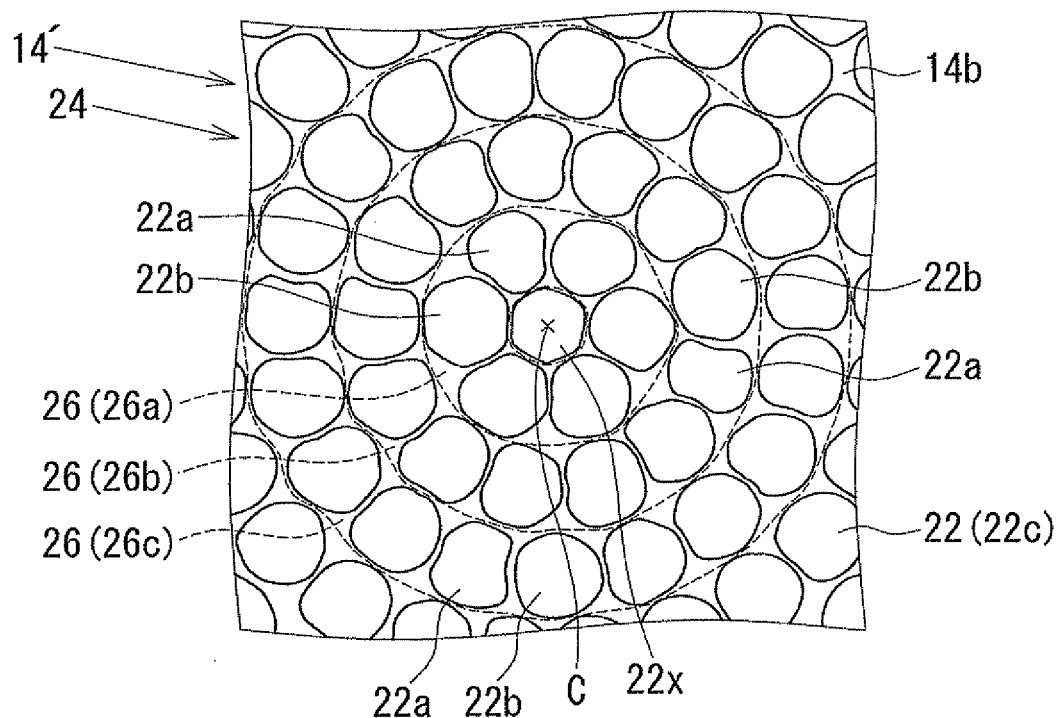
FIG. 3A is a plan view partially illustrating a light diffusing part provided on a lens sheet of the illuminating apparatus according to the second embodiment of the present invention.

Next, referring to FIG. 3, an illuminating apparatus 10' according to a second embodiment of the present invention will be explained. Compared to the illuminating apparatus 10 according to the first embodiment of the present invention shown in FIG. 1, the illuminating apparatus 10' according to the second embodiment of the present invention has the same structure except that the lens sheet 14 of the illuminating apparatus 10 is replaced with a lens sheet 14' as shown in FIG. 3A. Thus, in the illuminating apparatus 10' according to the second embodiment of the present invention, only the portions which are different from the illuminating apparatus 10 according to the first embodiment of the present invention shown will be explained, and any explanations of structural portions and operational effects thereof which are the same as those in the illuminating apparatus 10 according to the first embodiment of the present invention will be omitted. In FIG. 3, portions which are identical or corresponding to those in the lens sheet 14 and the mold matrix 30 according to the first embodiment of the present invention will be assigned the same reference numerals.

Figure 3B:
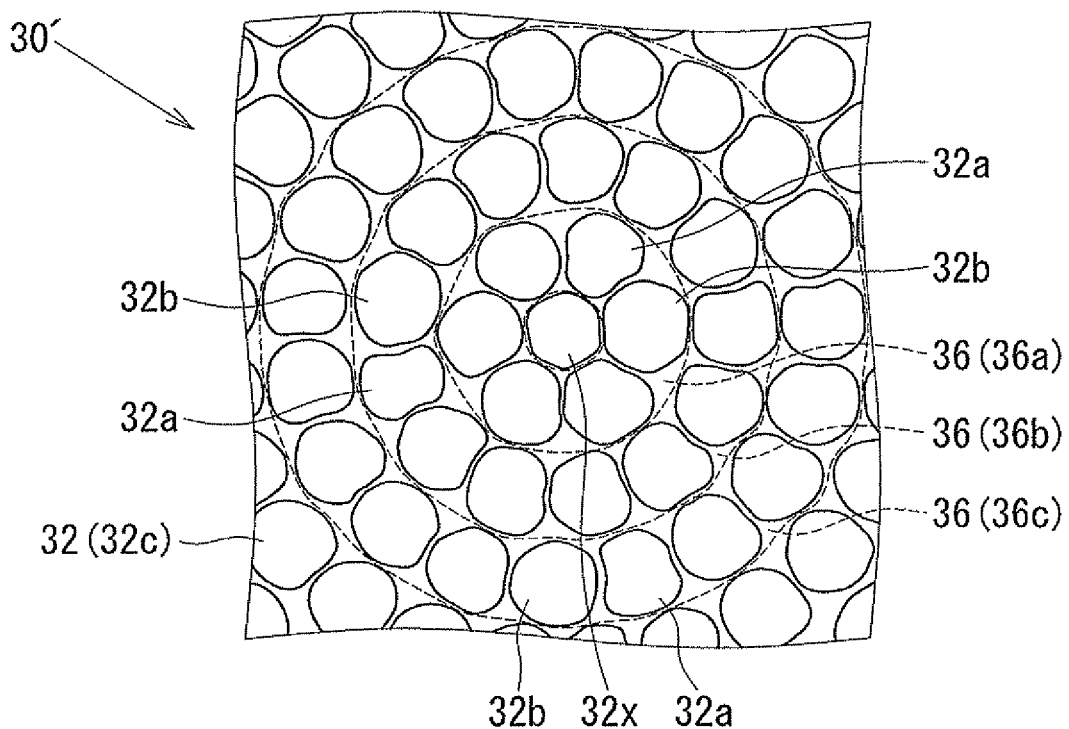
FIG. 3B is a partial plan view of a mold matrix for molding the lens sheet shown in FIG. 3A.

The illuminating apparatus 10' according to the second embodiment of the present invention has the lens sheet 4' to which the light diffusing part 24 is provided as shown in FIG. 3A. The lens sheet 14' is molded using a mold matrix 30' shown in FIG. 3B. As illustrated in FIG. 3B, a plurality of recesses 32 are fabricated on the mold matrix 30'. The first recess 32a and the second recess 32b fabricated in each annular row 36 of recesses concentrically arranged are fabricated at positions which are continuously arranged in a radial direction of the mold matrix 30 of FIG. 2B, whereas the first recess 32a and the second recess 32b are fabricated at positions which are not continuously arranged in a radial direction of the mold matrix 30' of FIG. 3B. In other words, the mold matrix 30' is set such that the positions at which the recesses 32 are fabricated first in each annular row 36 of recesses are not continuously arranged in a radial direction.

Further, as described above, in the lens sheet 14' of the illuminating apparatus 10' according to the second embodiment of the present invention molded using the mold matrix 30', the first light scattering element 22a corresponding to the first recess 32a and the second light scattering element 22b corresponding to the second recess 32b included in each annular row (26) of the light scattering elements 22 are formed at positions that are not continuously arranged in a radial direction as shown in FIG. 3A.

As described above, the illuminating apparatus 10' according to the second embodiment of the present invention has the lens sheet 14' shown in FIG. 3A molded using the mold matrix 30' shown in FIG. 3B. In the lens sheet 14', the first light scattering elements 22a included in the annular rows (26) of the plurality of light scattering elements 22 are disposed such that multiple first light scattering elements 22a are not continuously arranged in a radial direction. Further, by disposing the first light scattering elements 22a formed by the first recesses 32a which are fabricated first in each annular row 36 of recesses such that they are not continuous relative to the radial direction, the second light scattering elements 22b formed by the second recesses 32b which are fabricated last in each annular row 36 of recesses are also disposed such that they are not continuously arranged in a radial direction. Therefore, while scattering light emitted from the light source 12 with the plurality of light scattering elements 22, any decreases in uniformity of illuminated light for disposing the first and second light scattering elements 22a and 22b are also avoidable. Here, the first and second light scattering elements 22a and 22b have different shapes compared to the plurality of third light scattering elements 22c that occupy a majority of the light scattering elements 22 within the light diffusing part 24, the third light scattering elements 22c being continuously arranged in a radial direction.

In the illuminating apparatus 10' according to the second embodiment of the present invention, the lens sheet 14' can be molded using a mold matrix 30' in which the position of the first recess 32a fabricated first is randomly set in each annular row 36 of recesses. Thereby, in the lens sheet 14', each of the first light scattering elements 22a is formed at random positions within the light diffusing part 24, and thus they are not disposed continuously relative to the radial direction of the concentric circle arrangement. Accordingly, the second light scattering elements 22b which are adjacent to the first light scattering elements 22b are also not disposed continuously relative to the radial direction of the concentric circle arrangement. Therefore, in this case as well, any decreases in the uniformity of illuminated light caused by disposing the first and second light scattering elements 22a and 22b which have different shapes compared to the plurality of third light scattering elements 22c such that they are continuous relative to the radial direction of the concentric circle arrangement are also avoided.

What is claimed is:

1. An illuminating apparatus comprising:
   a light source, and
   a lens sheet that is arranged on an optical axis of the light source and that has a plurality of prisms concentrically arranged with the optical axis of the light source positioned center,
   wherein a light diffusing part including a plurality of distorted hemispherical light scattering elements is provided on the lens sheet,
   the distorted hemispherical light scattering elements are concentrically arranged in annular rows around the optical axis, the distorted hemispherical light scattering elements in each row being allowed to have plural types of light scattering elements, each having a different shape,
   the plural types of light scattering elements in each row include only one piece of first distorted light scattering element having a shape that is distorted in two directions due to influence of adjacent light scattering elements in each of the same annular row, and
   the first distorted light scattering element in each row is disposed randomly within the light diffusing part in a radial direction.

2. The illuminating apparatus according to claim 1, further comprising only one piece of second distorted light scattering element and a plurality of third distorted light scattering elements, wherein,
   the second distorted light scattering element is configured to be sandwiched between the first distorted light scattering element and one of the plurality of third distorted light scattering elements and has a shape not substantially distorted due to influence by the first distorted light scattering element and one of the third distorted light scattering elements, and
   the plurality of third distorted light scattering elements have a shape distorted in one direction due to influence of one of the adjacent light scattering elements.

3. The illuminating apparatus according to claim 2, wherein the light source is a white light source including a light emitting element and a fluorescent body that emits fluorescent light with light that has been emitted from the light emitting element.

4. The illuminating apparatus according to claim 1, wherein the light source is a white light source including a light emitting element and a fluorescent body that emits fluorescent light with light that has been emitted from the light emitting element.

5. The illuminating apparatus according to claim 4, wherein the light emitting element is constituted by a plurality of light emitting element chips arranged near each other.

6. A method for producing a lens sheet including a plurality of prisms concentrically arranged and a light diffusing part with a plurality of distorted hemispherical light scattering elements concentrically arranged, the method comprising the steps of:
   pressing an indenter on a surface of a mold matrix; and
   forming a plurality of recesses on the surface of the mold matrix, each annular row of the plurality of recesses being adapted to correspond to each annular row of distorted hemispherical light scattering elements concentrically arranged such that (i) the distorted hemispherical light scattering elements in each annular row have plural types of light scattering elements, each having a different shape and (ii) only one piece of first distorted light scattering element in each of the same annular row is disposed randomly within the light diffusing part in a radial direction.

7. The method for producing a lens sheet according to claim 6, wherein a position at which the indenter is pressed first in each annular row formed with the plurality of recesses is randomly set.

8. The method for producing a lens sheet according to claim 7, wherein the annular rows of the plurality of recesses concentrically arranged are formed sequentially from a center toward an outer circumference.

9. The method for producing a lens sheet according to claim 6, wherein the annular rows of the plurality of recesses concentrically arranged are formed sequentially from a center toward an outer circumference.

* * * * *